(12) United States Patent
Yang

(10) Patent No.: US 11,903,145 B2
(45) Date of Patent: Feb. 13, 2024

(54) WIRING BOARD AND SEMICONDUCTOR MODULE INCLUDING THE SAME

(71) Applicant: Samsung Electronics Co., Ltd., Suwon-si (KR)

(72) Inventor: Seung-Yeol Yang, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 50 days.

(21) Appl. No.: 17/379,026

(22) Filed: Jul. 19, 2021

(65) Prior Publication Data
US 2022/0210925 A1 Jun. 30, 2022

(30) Foreign Application Priority Data
Dec. 31, 2020 (KR) .................. 10-2020-0188652

(51) Int. Cl.
*H05K 1/11* (2006.01)
*H05K 3/46* (2006.01)

(52) U.S. Cl.
CPC .......... *H05K 3/4605* (2013.01); *H05K 1/112* (2013.01); *H05K 3/4644* (2013.01); *H05K 2201/0195* (2013.01); *H05K 2201/0209* (2013.01); *H05K 2203/1377* (2013.01)

(58) Field of Classification Search
None
See application file for complete search history.

(56) References Cited

U.S. PATENT DOCUMENTS

| | | | |
|---|---|---|---|
| 5,239,198 A | 8/1993 | Lin et al. | |
| 6,963,493 B2 | 11/2005 | Galvagni | |
| 7,916,492 B1 | 3/2011 | Zhong et al. | |
| 9,301,387 B2 | 3/2016 | Ryou | |
| 10,129,979 B2 | 11/2018 | Wang et al. | |
| 10,182,499 B2 | 1/2019 | Morshed | |
| 10,242,243 B2 | 3/2019 | Kim et al. | |
| 10,368,438 B2 | 7/2019 | Nishioka et al. | |
| 10,763,031 B2 * | 9/2020 | Jang ................. | H01F 41/042 |

(Continued)

FOREIGN PATENT DOCUMENTS

| | | |
|---|---|---|
| CN | 102176419 A | 9/2011 |
| CN | 103295996 A | 9/2013 |

(Continued)

*Primary Examiner* — Timothy J Thompson
*Assistant Examiner* — John B Freal
(74) *Attorney, Agent, or Firm* — Harness, Dickey & Pierce, P.L.C.

(57) ABSTRACT

A wiring board may include a core portion having first and second surfaces, and first and second buildup portions on the first and second surfaces, respectively. Each of the first and second buildup portions may include a first insulating layer on the core portion, a wire pattern on the first insulating layer, a second insulating layer on the first insulating layer to cover the wire pattern, and a protection layer covering the second insulating layer and exposing a portion of the wire pattern. The second insulating layer may include a resin layer and inorganic fillers distributed in the resin layer. The fillers may not be provided in the protection layer, and the resin layer of the second insulating layer and the protection layer may be formed of the same material. The wire patterns of the first and second buildup portions may be electrically connected to each other.

18 Claims, 12 Drawing Sheets

(56) References Cited

U.S. PATENT DOCUMENTS

| | | | |
|---|---|---|---|
| 2004/0245614 A1* | 12/2004 | Jobetto | H01L 24/27 257/E25.023 |
| 2009/0295500 A1 | 12/2009 | Ives | |
| 2014/0146507 A1* | 5/2014 | Lee | H01L 23/49827 174/257 |
| 2018/0070438 A1* | 3/2018 | Yamauchi | G11B 5/484 |
| 2019/0311982 A1* | 10/2019 | Yamaguchi | H01L 21/4857 |
| 2020/0051918 A1* | 2/2020 | Bae | H01L 23/5226 |

FOREIGN PATENT DOCUMENTS

| | | | |
|---|---|---|---|
| JP | 2003-101202 A | 4/2003 | |
| JP | 2014-049555 A | 3/2014 | |
| KR | 101005242 B1 | 1/2011 | |

* cited by examiner

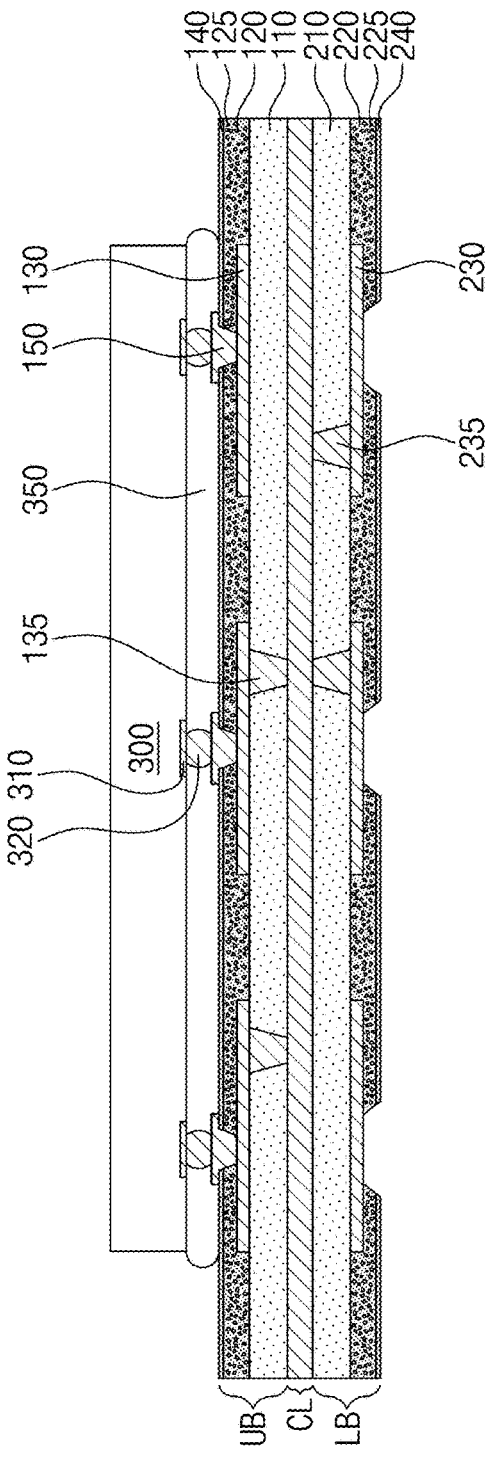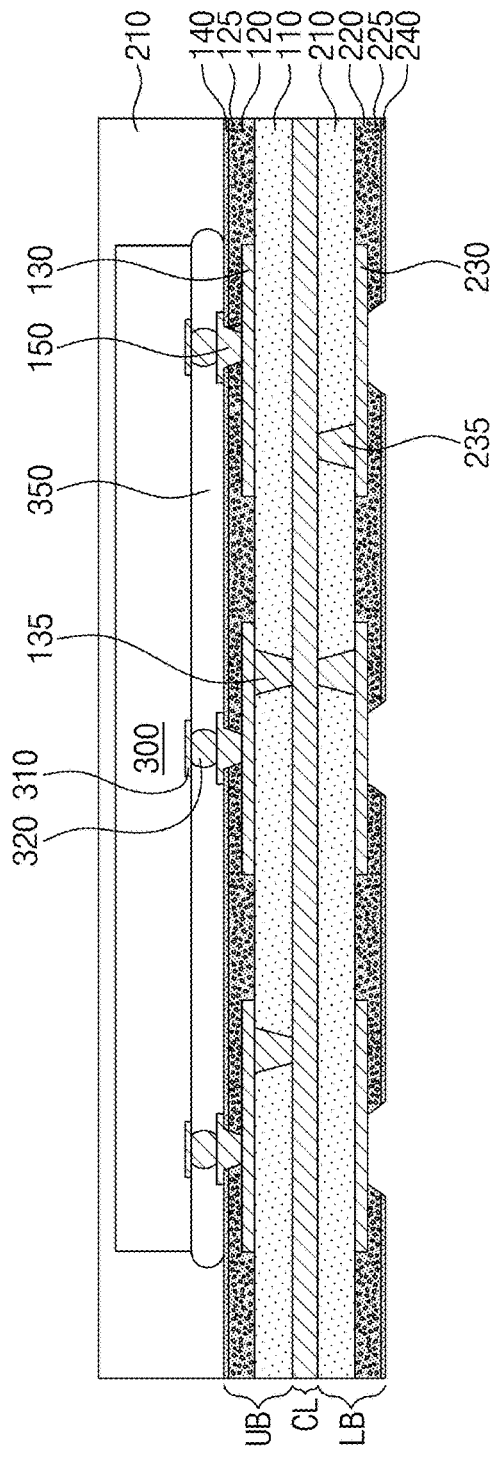

WIRING BOARD AND SEMICONDUCTOR MODULE INCLUDING THE SAME

CROSS-REFERENCE TO RELATED APPLICATIONS

This U.S. nonprovisional application claims priority under 35 U.S.C § 119 to Korean Patent Application No. 10-2020-0188652, filed on Dec. 31, 2020, in the Korean Intellectual Property Office, the disclosure of which is hereby incorporated by reference in its entirety.

BACKGROUND

1. Field

Embodiments relate to a wiring board and/or a semiconductor module including the same.

2. Description of the Related Art

For a printed circuit board (PCB) used as a wiring board, it may be necessary to meet high-speed and high-density properties that may be required in the electronics industry. To do this, many difficult requirements for the PCB may need to be solved, such as small linewidths, excellent electric characteristics, high reliability, high-speed signal transmission, and high-functionality.

A semiconductor module may include a semiconductor package and a wiring board, on which the semiconductor package may be mounted.

SUMMARY

Embodiments of inventive concepts may provide a wiring board with improved structural stability and a semiconductor module including the same.

Embodiments of inventive concepts may also provide a wiring board with a reduced size and a semiconductor module including the same.

According to an embodiment of inventive concepts, a wiring board may include a core portion having a first surface and a second surface, which are opposite to each other, and a first buildup portion on the first surface and a second buildup portion on the second surface, respectively. Each of the first buildup portion and the second buildup portion may include a first insulating layer on the core portion, a wire pattern on the first insulating layer, a second insulating layer on the first insulating layer to cover the wire pattern, and a protection layer covering the second insulating layer. The protection layer may expose a portion of the wire pattern. The second insulating layer may include a resin layer and fillers. The fillers may be distributed in the resin layer and may be formed of an inorganic material. The fillers may not be in the protection layer. The resin layer of the second insulating layer and the protection layer may be formed of the same material. The wire pattern of the first buildup portion may be electrically connected to the wire pattern of the second buildup portion.

According to an embodiment of inventive concepts, a semiconductor module may include a package substrate, a semiconductor chip on the package substrate, a mold layer on the package substrate to cover the semiconductor chip, and outer coupling terminals below the package substrate and connected to a lower surface of the package substrate. The package substrate may include a core portion, a first upper insulating layer embedding an upper wire pattern on a top surface of the core portion, upper fillers distributed in the first upper insulating layer, an upper protection layer covering the first upper insulating layer, a first lower insulating layer embedding a lower wire pattern on a top surface of the core portion, lower fillers distributed in the first lower insulating layer, and a lower protection layer covering the first lower insulating layer. The mold layer may be spaced apart from the first upper insulating layer and the upper fillers by the upper protection layer. The first upper insulating layer and the upper protection layer may be made of the same material, and the first lower insulating layer and the lower protection layer may be made of the same material. A thickness of the upper protection layer and a thickness of the lower protection layer may range from 1 μm to 3 μm.

According to an embodiment of inventive concepts, a wiring board may include a core portion and buildup portions on opposite surfaces of the core portion. Each of the buildup portions may include a first insulating layer on the core portion, a wire pattern on the first insulating layer, a second insulating layer on the first insulating layer to cover the wire pattern, fillers distributed in the second insulating layer, and a protection layer covering the second insulating layer. The protection layer may expose a portion of the wire pattern. The second insulating layer may be formed of a material different from the first insulating layer. The protection layer may be formed of the same material as the second insulating layer. The wire patterns of the buildup portions may be electrically connected to each other. A thickness of the protection layer may range from 1 μm to 3 μm. A degree of roughness of a surface of the protection layer facing the core portion may be greater than a degree of roughness of the second insulating layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 15 and 16 are sectional views illustrating a method of fabricating a semiconductor module, according to an embodiment of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown.

Figure 1:
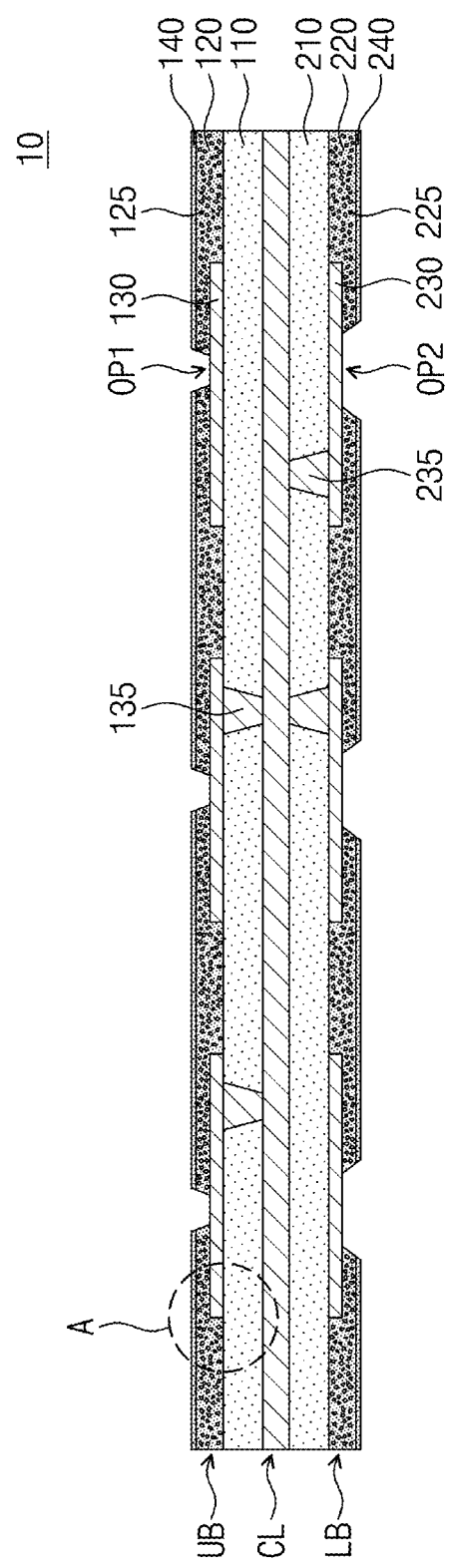
FIG. 1 is a sectional view illustrating a wiring board according to an embodiment of inventive concepts.
Figure 2:
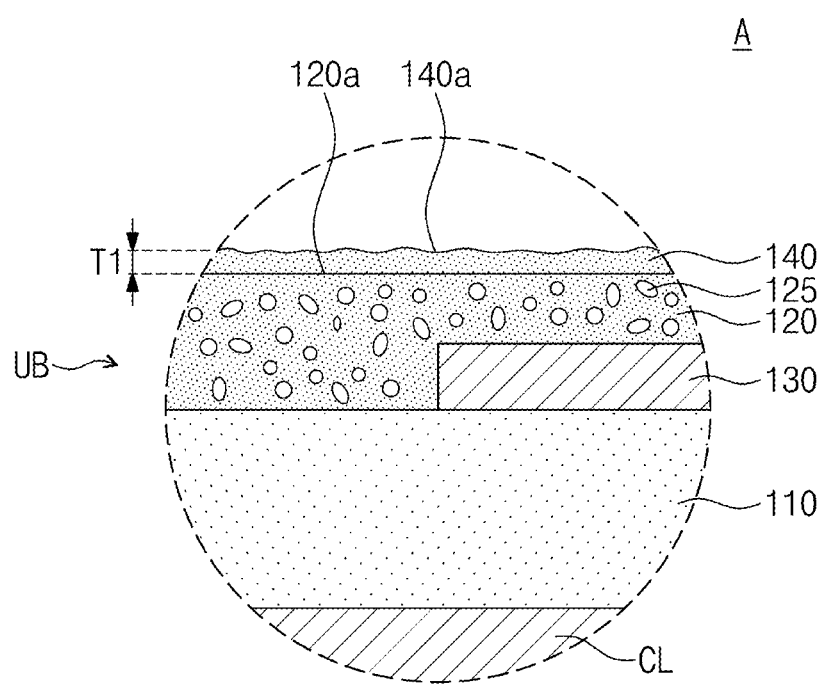
FIG. 2 is an enlarged sectional view of a portion A of FIG. 1.

FIG. 1 is a sectional view illustrating a wiring board according to an embodiment of inventive concepts. FIG. 2 is an enlarged sectional view of a portion A of FIG. 1.

Referring to FIGS. 1 and 2, a wiring board 10 may include a core portion CL, an upper buildup portion UB disposed on a top surface of the core portion CL, and a lower buildup portion LB disposed on a bottom surface of the core portion CL.

The core portion CL may be extended in a specific direction. The core portion CL may include at least one core pattern. The core pattern may be provided in the core portion CL and may be provided in a center portion of the wiring board 10 in the extension direction of the core portion CL. According to an embodiment of inventive concepts, the core portion CL is illustrated to have one core pattern, but inventive concepts are not limited to this example. In an embodiment, the core portion CL may include two or more core patterns. In other words, the wiring board 10 may include a plurality of core patterns, which are horizontally spaced apart from each other. Here, the core patterns may be disposed such that side surfaces thereof face each other. The core portion CL may be formed of or include at least one of insulating materials. For example, the core portion CL may include one of glass fiber, ceramic plate, epoxy, or resin. Alternatively, the core portion CL may include one selected from the group consisting of stainless steel, aluminum (Al), nickel (Ni), magnesium (Mg), zinc (Zn), tantalum (Ta), or combinations thereof. In the case where the core portion CL includes an insulating material, the core portion CL may have a vertical connection terminal, which is disposed to vertically penetrate the core portion CL. The vertical connection terminal may connect the upper buildup portion UB and the lower buildup portion LB, which are electrically connected to each other.

The lower and upper buildup portions LB and UB may cover the bottom and top surfaces, respectively, of the core portion CL.

The upper buildup portion UB may include a plurality of upper insulating layers 110, 120, and 140 and an upper wire pattern 130, which are provided on the top surface of the core portion CL. For example, the upper insulating layers 110, 120, and 140 may include a first upper insulating layer 110, a second upper insulating layer 120, and an upper protection layer 140, which are sequentially stacked.

The first upper insulating layer 110 may be provided on the top surface of the core portion CL. The first upper insulating layer 110 may cover the top surface of the core portion CL. The first upper insulating layer 110 may be formed of or include at least one of insulating materials. For example, the first upper insulating layer 110 may include at least one of prepreg, Ajinomoto build-up film (ABF), FR-4, or bismaleimide triazine (BT).

The upper wire pattern 130 may be provided on the first upper insulating layer 110. The upper wire pattern 130 may be disposed on a top surface of the first upper insulating layer 110. The upper wire pattern 130 may include a circuit pattern. The upper wire pattern 130 may be used as a connection pattern for rewiring a device mounted on the wiring board 10. The upper wire pattern 130 may be formed of or include one selected from the group consisting of copper (Cu), aluminum (Al), silver (Ag), tin (Sn), gold (Au), nickel (Ni), lead (Pb), titanium (Ti), or combinations thereof.

Since, although not shown in detail, the upper wire pattern 130 includes circuit patterns, the upper wire pattern 130 may be electrically connected to the core patterns of the core portion CL. For example, upper vias 135 may be provided in the first upper insulating layer 110 to vertically penetrate the first upper insulating layer 110. The upper vias 135 may connect the upper wire pattern 130 to the core patterns of the core portion CL. The upper vias 135 may be formed of or include one selected from the group consisting of aluminum (Al), silver (Ag), tin (Sn), gold (Au), nickel (Ni), lead (Pb), titanium (Ti), or combinations thereof.

The second upper insulating layer 120 may be provided on the first upper insulating layer 110. The second upper insulating layer 120 may cover the top surface of the first upper insulating layer 110. Also, the second upper insulating layer 120 may embed at least a portion of the upper wire pattern 130. The second upper insulating layer 120 may include at least one of insulating materials. For example, the second upper insulating layer 120 may be formed of or include a solder resist.

Upper fillers 125 may be provided in the second upper insulating layer 120. The upper fillers 125 may be distributed in the second upper insulating layer 120. Each of the upper fillers 125 may be shaped like a bead, a wire, or a rod. The upper fillers 125 may be provided to have a volume fraction that is 1% to 50% of a volume of the second upper insulating layer 120. A width, diameter, or length of the upper fillers 125 may range from 0.1 μm to 1 μm. The upper fillers 125 may be provided to improve thermal conductivity of the second upper insulating layer 120. Accordingly, the thermal conductivity of the upper buildup portion UB may be improved. The upper fillers 125 may be formed of or include at least one of insulating materials. The upper fillers 125 may be formed of or include a material which has high thermal conductivity. As an example, the upper fillers 125 may be formed of or include silicon oxide (e.g., amorphous-$SiO_2$ or crystalline-$SiO_2$). As another example, the upper fillers 125 may be formed of or include at least one of aluminum oxide ($Al_2O_3$), magnesium oxide (MgO), zinc oxide (ZnO), silicon carbide (SiC), aluminum nitride (AlN), beryllium oxide (BeO), or boron nitride (BN). In an embodiment, the upper fillers 125 may be formed of or include an insulating material having high thermal conductivity.

The upper protection layer 140 may be provided on the second upper insulating layer 120. The upper protection layer 140 may cover a top surface 120a of the second upper insulating layer 120. The upper protection layer 140 may protect the upper buildup portion UB such that the upper fillers 125 in the second upper insulating layer 120 do not protrude above a top surface of the upper buildup portion UB. In this case, structural stability of the wiring board 10 may be improved. A thickness T1 of the upper protection layer 140 may range from 1 μm to 3 μm. In the case where the thickness T1 of the upper protection layer 140 is smaller than 1 μm, the upper protection layer 140 may be damaged by an external impact, and thus, the second upper insulating layer 120 and the upper fillers 125 may be exposed to the outside. In the case where the thickness T1 of the upper protection layer 140 is larger than 3 μm, the upper buildup portion UB may have an excessively large thickness. According to an embodiment of inventive concepts, since the upper protection layer 140 is formed to an appropriate thickness, it may be possible to limit and/or prevent the thickness of the upper buildup portion UB and the size of the wiring board 10 from being excessively increased. A degree of roughness of a top surface 140a of the upper protection layer 140 may be greater than a degree of roughness of the top surface 120a of the second upper insulating layer 120. The upper protection layer 140 may be formed of or include at least one of insulating materials. The upper protection layer 140 may be formed of or include the same material as the second upper insulating layer 120. For example, the upper protection layer 140 may be formed of or include a solder resist.

A first opening OP1 may be formed on the upper protection layer 140. The first opening OP1 may be provided to penetrate the upper protection layer 140 and the second upper insulating layer 120 and to expose a portion of the upper wire pattern 130. The exposed portion of the upper wire pattern 130 may be used as a substrate pad for connecting another semiconductor device or electronic device to the wiring board 10. Alternatively, the wiring board 10 may further include an under-bump pad provided on the upper buildup portion UB, and in this case, the under-bump pad may be coupled to the upper wire pattern 130 through the first opening OP1.

The lower buildup portion LB and the upper buildup portion UB may be provided to have a symmetric structure about the core portion CL. For example, the lower buildup portion LB may include a plurality of lower insulating layers 210, 220, and 240 and a lower wire pattern 230, which are provided on the bottom surface of the core portion CL. For example, the lower insulating layers 210, 220, and 240 may include a first lower insulating layer 210, a second lower insulating layer 220, and a lower protection layer 240, which are sequentially stacked.

The first lower insulating layer 210 may be provided on the bottom surface of the core portion CL. The first lower insulating layer 210 may cover the bottom surface of the core portion CL. The first lower insulating layer 210 may be formed of or include at least one of insulating materials. For example, the first lower insulating layer 210 may include at least one of prepreg, Ajinomoto build-up film (ABF), FR-4, or bismaleimide triazine (BT).

The lower wire pattern 230 may be provided below the first lower insulating layer 210. The lower wire pattern 230 may be disposed on a bottom surface of the first lower insulating layer 210. The lower wire pattern 230 may include a circuit pattern. The lower wire pattern 230 may be used as a connection pattern, to which an outer terminal coupled to the wiring board 10 is coupled. The lower wire pattern 230 may be formed of or include one selected from the group consisting of copper (Cu), aluminum (Al), silver (Ag), tin (Sn), gold (Au), nickel (Ni), lead (Pb), titanium (Ti), or combinations thereof.

Since, although not shown in detail, the lower wire pattern 230 includes circuit patterns, the upper wire pattern 130 may be electrically connected to the core patterns of the core portion CL. For example, lower vias 235 may be provided in the first lower insulating layer 210 to vertically penetrate the first lower insulating layer 210. The lower vias 235 may connect the lower wire pattern 230 to the core patterns of the core portion CL. The lower vias 235 may be formed of or include one selected from the group consisting of aluminum (Al), silver (Ag), tin (Sn), gold (Au), nickel (Ni), lead (Pb), titanium (Ti), or combinations thereof.

In addition, the lower wire pattern 230 and the upper wire pattern 130 may be electrically connected to each other and may be spatially separated from each other by the core portion CL. In the case where the core portion CL includes conductive core patterns, the lower wire pattern 230 and the upper wire pattern 130 may be electrically connected to each other through the core patterns of the core portion CL. In the case where the core portion CL includes at least one of insulating materials, the lower wire pattern 230 and the upper wire pattern 130 may be electrically connected to each other through the vertical connection terminal of the core portion CL.

The second lower insulating layer 220 may be provided on the first lower insulating layer 210. The second lower insulating layer 220 may cover the bottom surface of the first lower insulating layer 210. Also, the second lower insulating layer 220 may embed at least a portion of the lower wire pattern 230. The second lower insulating layer 220 may be formed of or include at least one of insulating materials. For example, the second lower insulating layer 220 may include a solder resist.

Lower fillers 225 may be provided in the second lower insulating layer 220. The lower fillers 225 may be distributed in the second lower insulating layer 220. Each of the lower fillers 225 may be shaped like a bead, a wire, or a rod. The lower fillers 225 may be provided to have a volume fraction that is 1% to 50% of a volume of the second lower insulating layer 220. A width, diameter, or length of the lower fillers 225 may range from 0.1 μm to 1 μm. The lower fillers 225 may improve thermal conductivity of the second lower insulating layer 220. Accordingly, the thermal conductivity of the lower buildup portion LB may be improved. The lower fillers 225 may be formed of or include at least one of insulating materials. The lower fillers 225 may include a material having high thermal conductivity. As an example, the lower fillers 225 may be formed of or include silicon oxide (e.g., amorphous-$SiO_2$ or crystalline-$SiO_2$). As another example, the lower fillers 225 may be formed of or include at least one of aluminum oxide ($Al_2O_3$), magnesium oxide (MgO), zinc oxide (ZnO), silicon carbide (SiC), aluminum nitride (AlN), beryllium oxide (BeO), or boron nitride (BN). In an embodiment, the lower fillers 225 may be formed of or include an insulating material having high thermal conductivity.

The lower protection layer 240 may be provided below the second lower insulating layer 220. The lower protection layer 240 may cover a top surface of the second lower insulating layer 220. The lower protection layer 240 may protect the lower buildup portion LB such that the lower fillers 225 in the second lower insulating layer 220 do not protrude above a bottom surface of the lower buildup portion LB. Accordingly, structural stability of the wiring board 10 may be improved. The thickness T1 of the lower protection layer 240 may range from 1 μm to 3 μm. In the case where the thickness of the lower protection layer 240 is smaller than 1 μm, the lower protection layer 240 may be damaged by an external impact, and in this case, the second lower insulating layer 220 and the lower fillers 225 may be exposed to the outside. In the case where the thickness of the lower protection layer 240 is larger than 3 μm, the lower buildup portion LB may have an excessively large thickness. According to an embodiment of inventive concepts, since the lower protection layer 240 is formed to an appropriate thickness, it may be possible to limit and/or prevent the thickness of the lower buildup portion LB and the size of the wiring board 10 from being excessively increased. A degree of roughness of a bottom surface of the lower protection layer 240 may be greater than a degree of roughness of a bottom surface of the second lower insulating layer 220. The lower protection layer 240 may be formed of or include at least one of insulating materials. The lower protection layer 240 may be formed of or include the same material as the second lower insulating layer 220. For example, the lower protection layer 240 may be formed of or include a solder resist.

A second opening OP2 may be formed on the lower protection layer 240. The second opening OP2 may be provided to penetrate the lower protection layer 240 and the second lower insulating layer 220 and to expose a portion of the lower wire pattern 230. The exposed portion of the lower wire pattern 230 may be used as a substrate pad for coupling the outer terminal to the wiring board 10.

FIG. 1 illustrates an example in which one upper wire pattern 130 is provided in the upper buildup portion UB and one lower wire pattern 230 is provided in the lower buildup portion LB, but inventive concepts are not limited to this example.

In an embodiment, a plurality of upper insulating layers and upper wire patterns, which are buried in the upper insulating layers, may be provided between the core portion CL and the first upper insulating layer 110. The number of the upper wire patterns and the number of the upper insulating layers may be changed depending on the number, structure, or design of circuit wires, which will be re-wired by the wiring board 10.

A plurality of lower insulating layers and lower wire patterns, which are buried in the lower insulating layers, may be provided between the core portion CL and the first lower insulating layer 210. The number of the lower wire patterns and the number of the lower insulating layers may be changed depending on the number, structure, or design of circuit wires, which will be re-wired by the wiring board 10.

Figure 3:
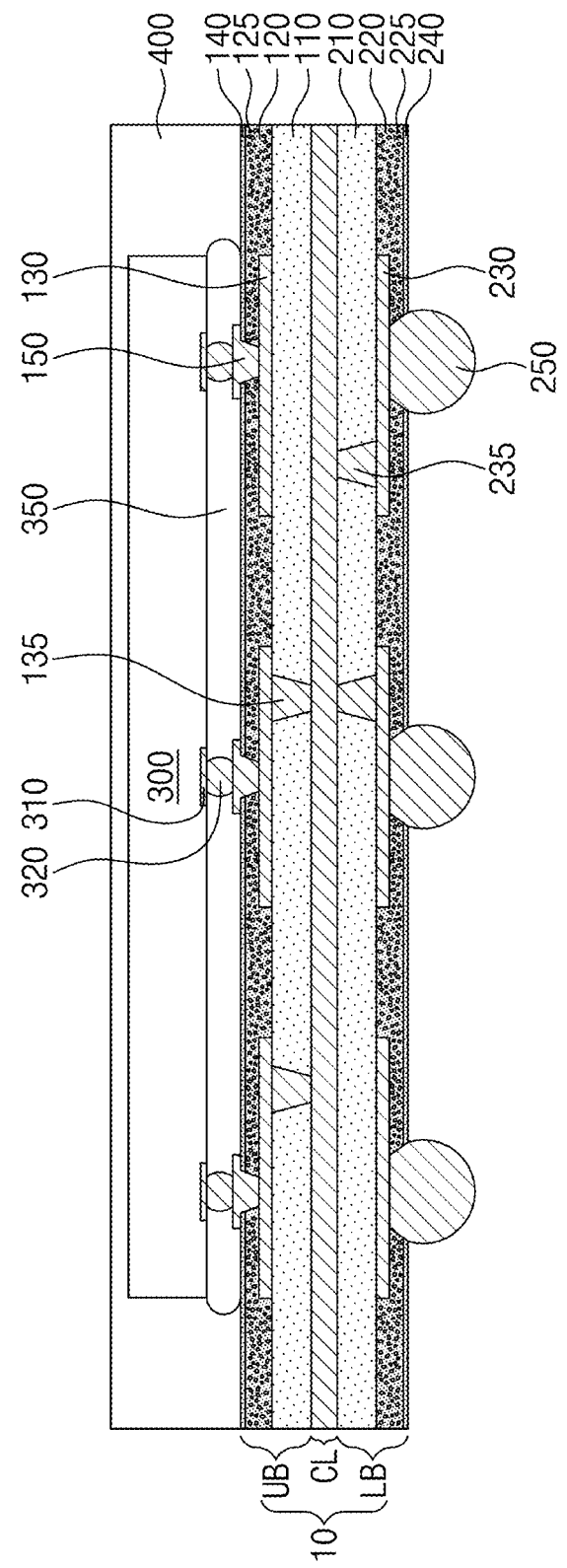
FIGS. 3 and 4 are sectional views, each of which illustrates a semiconductor module according to an embodiment of inventive concepts.
Figure 4:
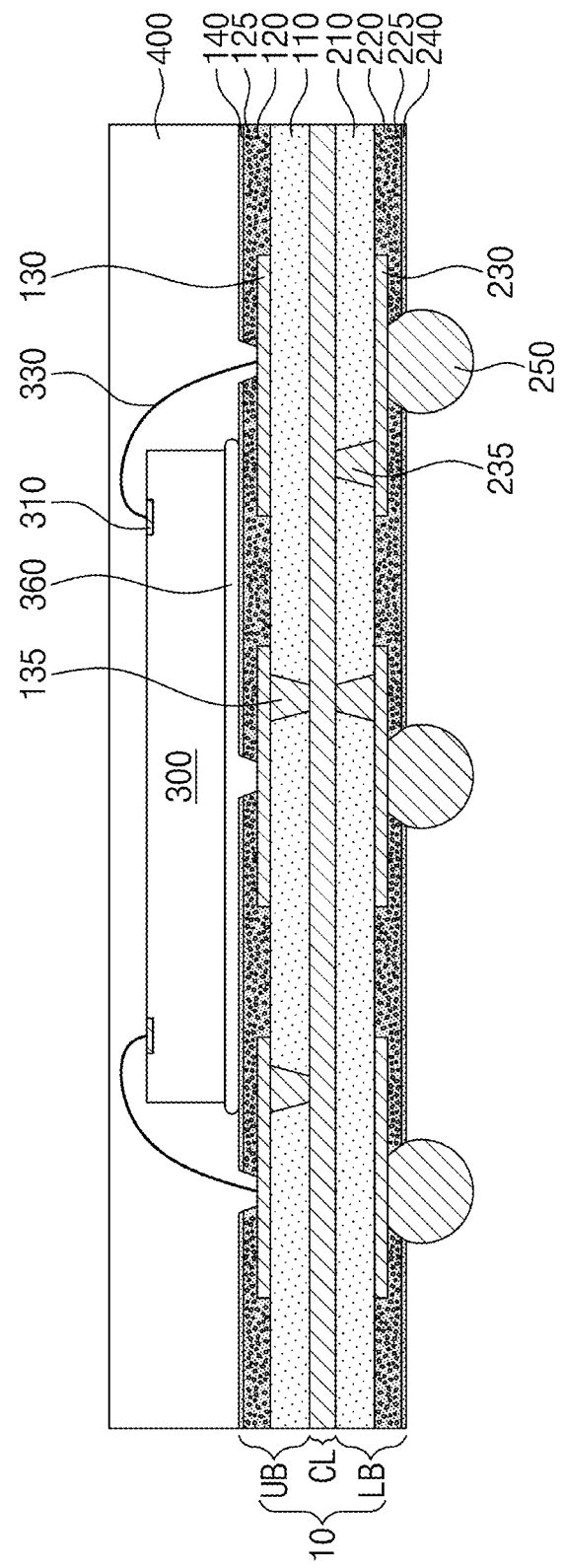

FIGS. 3 and 4 are sectional views, each of which illustrates a semiconductor module according to an embodiment of inventive concepts.

Referring to FIG. 3, the wiring board 10 may be provided. The wiring board 10 may be provided to have substantially the same or similar features as that described with reference to FIGS. 1 and 2. For example, the wiring board 10 may include the core portion CL, the upper buildup portion UB disposed on the top surface of the core portion CL, and the lower buildup portion LB disposed on the bottom surface of the core portion CL. The wiring board 10 may be referred to as a package substrate.

The upper buildup portion UB may include the first upper insulating layer 110, the second upper insulating layer 120, and the upper protection layer 140, which are sequentially stacked on the top surface of the core portion CL, and the upper wire pattern 130, which is provided on the first upper insulating layer 110 and is at least partially embedded by the second upper insulating layer 120. The upper fillers 125 may be provided in the second upper insulating layer 120. The upper protection layer 140 may cover the second upper insulating layer 120 and may have first openings exposing portions of the upper wire pattern 130.

The upper buildup portion UB may further include under-bump pads 150 provided on the upper protection layer 140. The under-bump pads 150 may fill the first openings. The under-bump pads 150 may be elements, which are formed to have a width larger than the first openings and are coupled to chip terminals of a semiconductor chip, which will be described below. The under-bump pads 150 may be provided in the first openings and may be coupled to the upper wire pattern 130. The under-bump pads 150 may be formed of or include at least one of conductive materials.

The lower buildup portion LB may include the first lower insulating layer 210, the second lower insulating layer 220, and the lower protection layer 240, which are sequentially stacked on the bottom surface of the core portion CL, and the lower wire pattern 230, which is provided on the first lower insulating layer 210 and is at least partially embedded by the second lower insulating layer 220. The lower fillers 225 may be provided in the second lower insulating layer 220. The lower protection layer 240 may cover the second lower insulating layer 220 and may have second openings exposing portions of the lower wire pattern 230.

Outer terminals 250 may be provided below the wiring board 10 and connected to the wiring board 10. The outer terminals 250 may be disposed in the second openings. In the second openings, the outer terminals 250 may be coupled to the lower wire pattern 230. The outer terminals 250 may fill the second openings. The outer terminals 250 may include solder balls or solder bumps.

A semiconductor chip 300 may be disposed on the wiring board 10. A bottom surface of the semiconductor chip 300 facing the wiring board 10 may be an active surface. The semiconductor chip 300 may include chip pads 310 which are provided on the bottom surface of the semiconductor chip 300. The semiconductor chip 300 may be formed of or include silicon (Si). As shown in FIG. 3, the semiconductor chip 300 may be mounted on the wiring board 10 in a flip-chip manner. For example, the semiconductor chip 300 may have chip terminals 320 which are provided on the chip pads 310. The chip terminals 320 may be coupled to the chip pads 310 of the semiconductor chip 300 and the under-bump pads 150 of the wiring board 10. The chip terminals 320 may include solder balls or solder bumps. The semiconductor chip 300 may be electrically connected to the outer terminals 250 through the under-bump pads 150, the upper buildup portion UB, and the lower buildup portion LB of the wiring board 10. In the wiring board 10, the upper wire pattern 130 and the lower wire pattern 230 may be used as a redistribution structure for the semiconductor chip 300.

FIG. 3 illustrates an example in which the semiconductor chip 300 is provided in a face-down manner, but inventive concepts are not limited to this example. As shown in FIG. 4, the semiconductor chip 300 may be provided in a face-up manner.

Referring to FIG. 4, the upper buildup portion UB of the wiring board 10 may not have the under-bump pads 150 (e.g., see FIG. 3). In other words, portions of the upper wire pattern 130 may be exposed by the first openings of the upper protection layer 140.

The semiconductor chip 300 may be disposed on the wiring board 10. The bottom surface of the semiconductor chip 300 facing the wiring board 10 may be an inactive surface, and a top surface of the semiconductor chip 300 may be an active surface. The semiconductor chip 300 may have the chip pads 310 provided on the top surface of the semiconductor chip 300. The semiconductor chip 300 may be mounted on the wiring board 10 in a wire bonding manner. For example, bonding wires 330 may be extended from top surfaces of the chip pads 310 to the exposed top surface of the upper wire pattern 130 to connect the chip pads 310 to the upper wire patterns 130. The semiconductor chip 300 may be electrically connected to the wiring board 10 through the bonding wires 330. The description that follows will refer to the embodiment of FIG. 3.

In an embodiment, the semiconductor chip 300, which is provided on the wiring board 10, may not include a transistor provided therein. That is, unlike the illustrated structure, an interposer substrate, not a chip, may be disposed on the wiring board 10. The interposer substrate may be formed of or include silicon (Si). The interposer substrate may have a circuit, which is provided on a top surface of the interposer substrate and is used for wiring. The interposer substrate may be enclosed by a mold layer, if necessary. Here, the mold layer is an element distinct from a mold layer 400, which will be described below. The mold layer may be provided on the wiring board 10 to embed at least a portion of the interposer substrate. In other words, the interposer substrate may be covered with the mold layer. At least one device (e.g., a chip including a transistor, an electronic device required for a semiconductor package, and so forth) may be provided on the interposer substrate. The at least one device may be electrically connected to the wiring board 10 and the interposer substrate through a via or the like, which are provided to penetrate the mold layer or the interposer substrate. In the case where the mold layer is not provided, the at least one device may be directly mounted on the interposer substrate. In the case where a plurality of devices are provided, the devices may be electrically connected to each other through the interposer substrate. If necessary, an additional substrate may be provided between the at least one device and the interposer substrate (or the mold layer) to support the at least one device. Here, since the at least one device is mounted on the additional substrate, the at least one device may be electrically connected to the interposer substrate and the wiring board 10 through the additional substrate and the via. The description that follows will refer to an example in which the semiconductor chip 300 is provided on the wiring board 10.

Referring further to FIG. 3, the mold layer 400 may be provided on the wiring board 10. The mold layer 400 may cover the semiconductor chip 300, on the top surface of the wiring board 10. For example, the mold layer 400 may cover top and side surfaces of the semiconductor chip 300. The mold layer 400 may fill a space between the semiconductor chip 300 and the wiring board 10. The mold layer 400 may be formed of or include at least one of insulating materials (e.g., epoxy polymers). For example, the mold layer 400 may be formed of or include an epoxy molding compound (EMC). Alternatively, the space between the semiconductor chip 300 and the wiring board 10 may be filled with an under-fill member 350 (e.g., see FIG. 3) or an adhesive member 360 (e.g., see FIG. 4).

Figure 7:
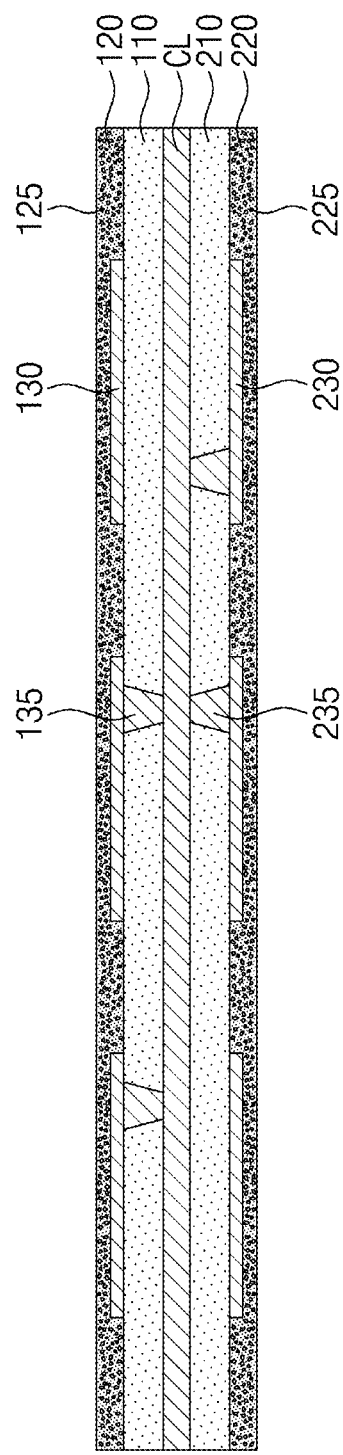
Figure 8:
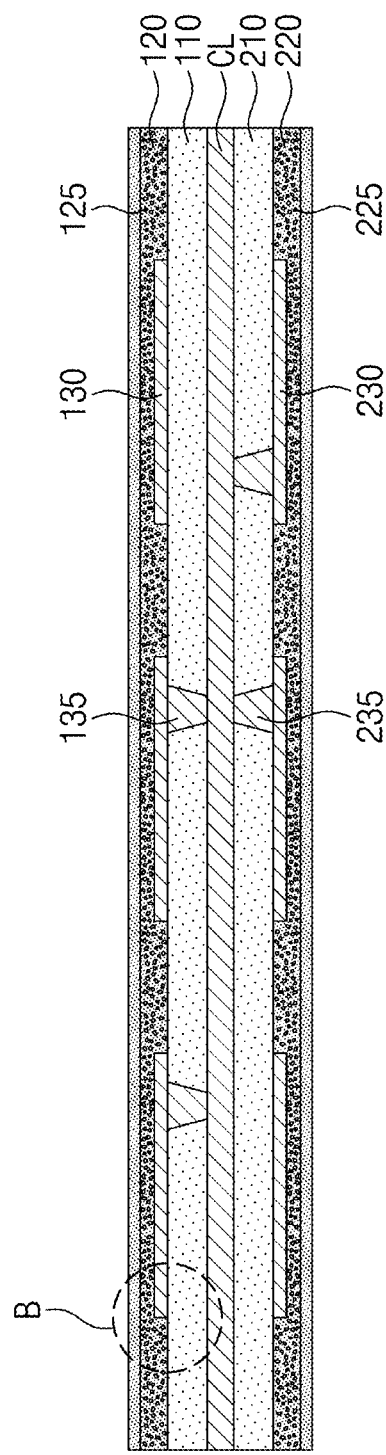
Figure 9:
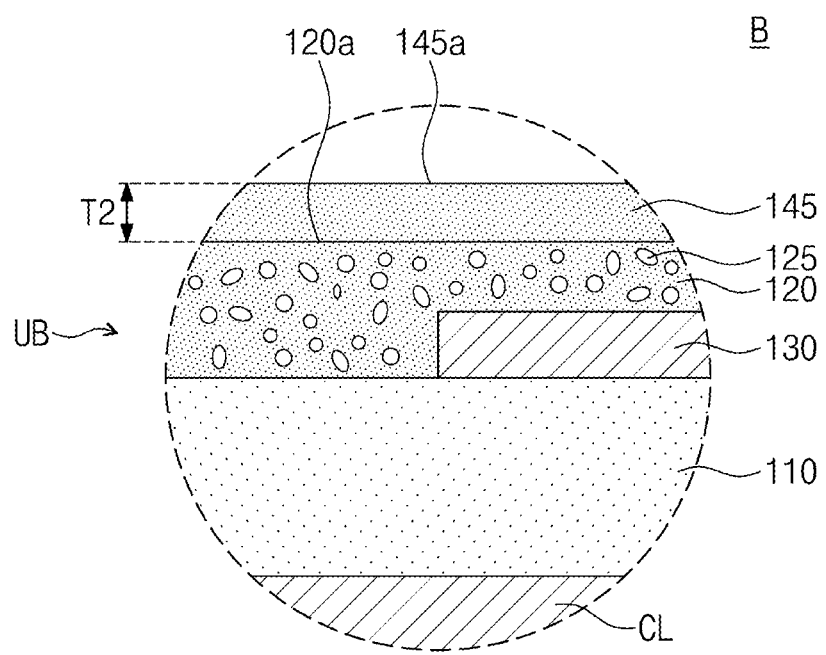
FIG. 9 is an enlarged sectional view of a portion B of FIG. 8.
Figure 10:
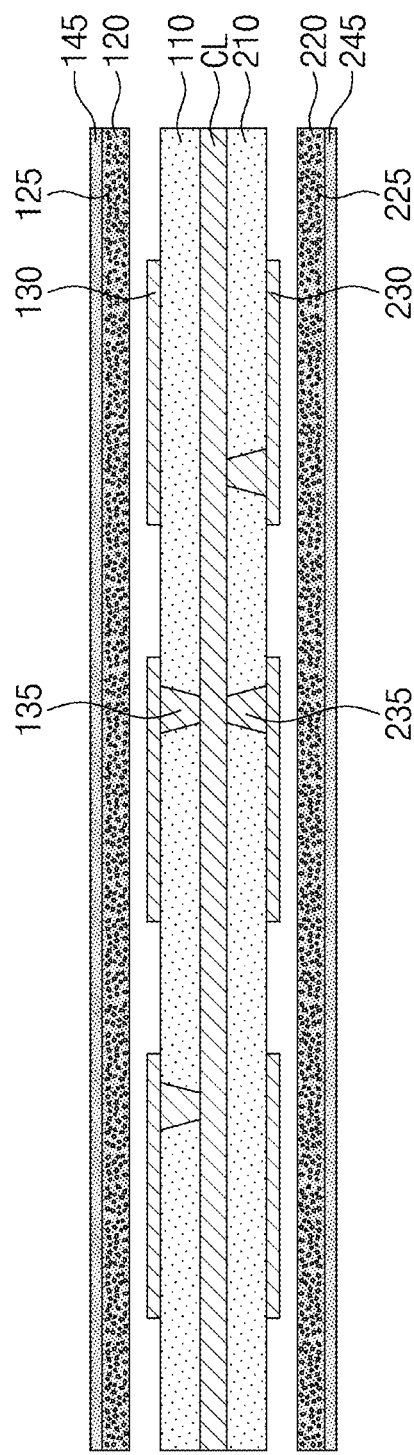
Figure 11:
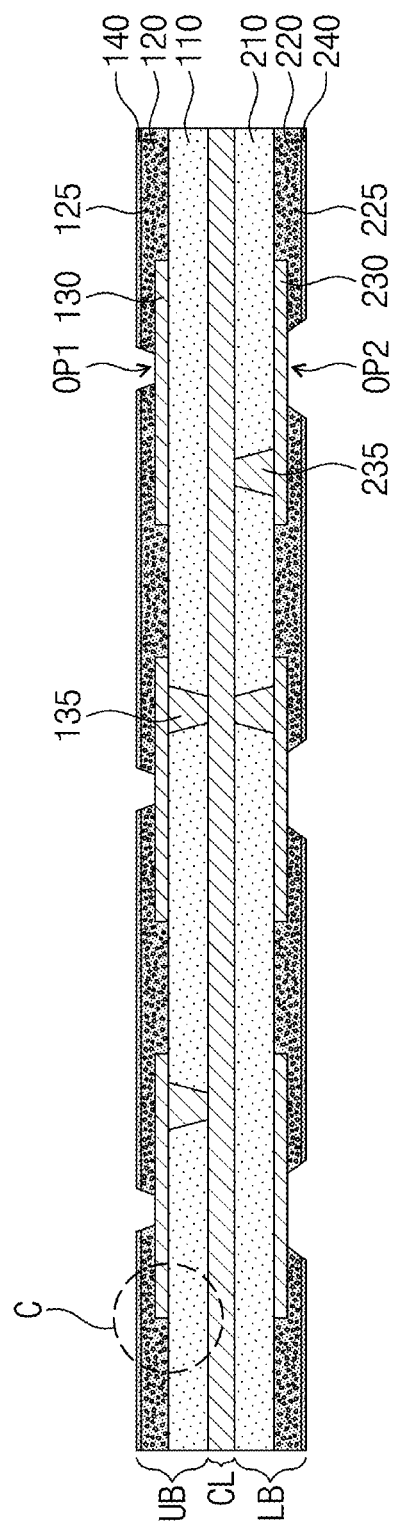
Figure 12:
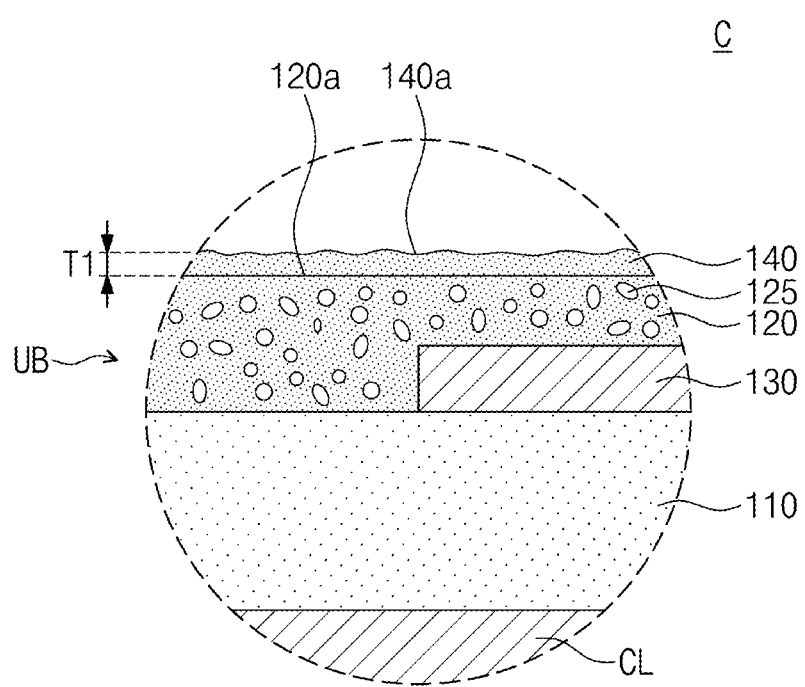
FIG. 12 is an enlarged sectional view of a portion C of FIG. 11.

FIGS. 5 to 12 are diagrams illustrating a method of fabricating a wiring board, according to an embodiment of inventive concepts. In detail, FIGS. 5 to 8 and FIGS. 10 to 11 are sectional views illustrating a method of fabricating a wiring board according to an embodiment of inventive concepts, and FIG. 9 is an enlarged sectional view of a portion B of FIG. 8. FIG. 12 is an enlarged sectional view of a portion C of FIG. 11.

Figure 5:
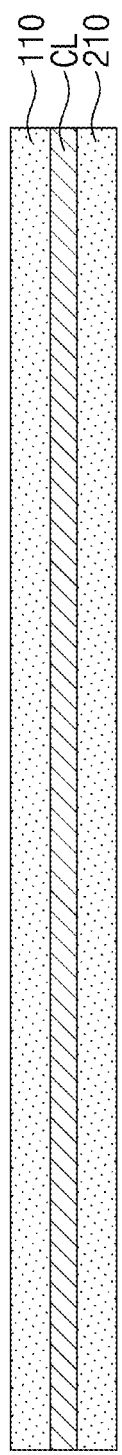
FIGS. 5 to 8 and FIGS. 10 to 11 are sectional views illustrating a method of fabricating a wiring board, according to an embodiment of inventive concepts.

Referring to FIG. 5, the core portion CL may be provided. The core portion CL may include at least one core pattern.

The first upper insulating layer 110 may be formed on the core portion CL. For example, the first upper insulating layer 110 may be formed by depositing or coating an insulating material on the top surface of the core portion CL. The insulating material may include prepreg, Ajinomoto build-up film (ABF), FR-4, or bismaleimide triazine (BT).

The first lower insulating layer 210 may be formed below the core portion CL. For example, the first lower insulating layer 210 may be formed by depositing or coating an insulating material on the bottom surface of the core portion CL. The insulating material may include prepreg, Ajinomoto build-up film (ABF), FR-4, or bismaleimide triazine (BT).

Figure 6:
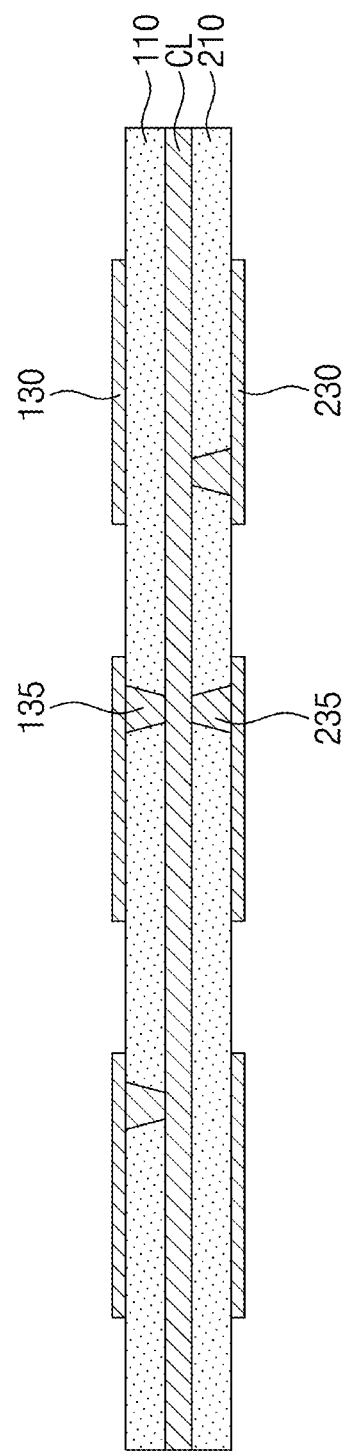

Referring to FIG. 6, the upper vias 135 and the upper wire pattern 130 may be formed on the first upper insulating layer 110. For example, the first upper insulating layer 110 may be patterned. The core portion CL may be exposed as a result of the patterning of the first upper insulating layer 110. A conductive layer may be formed on the top surface of the first upper insulating layer 110 and may be patterned to form the upper wire pattern 130. Here, portions of the conductive layer, which fill the patterned portions of the first upper insulating layer 110, may form the upper vias 135. That is, the upper vias 135 may penetrate the first upper insulating layer 110 and may connect the upper wire pattern 130 to the core portion CL.

The lower vias 235 and the lower wire pattern 230 may be formed on the first lower insulating layer 210. For example, the first lower insulating layer 210 may be patterned. The core portion CL may be exposed as a result of the patterning of the first lower insulating layer 210. The lower wire pattern 230 may be formed by forming a conductive layer on the bottom surface of the first lower insulating layer 210 and patterning the conductive layer. Here, portions of the conductive layer, which fill the patterned portions of the first lower insulating layer 210, may form the lower vias 235. In other words, the lower vias 235 may penetrate the first lower insulating layer 210 and may connect the lower wire pattern 230 to the core portion CL.

Referring to FIG. 7, the second upper insulating layer 120, in which the upper fillers 125 are distributed, may be formed on the first upper insulating layer 110. For example, the second upper insulating layer 120 may be formed by coating or depositing a precursor material, which includes the upper fillers 125 mixed with an insulating material, on the top surface of the first upper insulating layer 110 and hardening the insulating material. Alternatively, the second upper insulating layer 120 may be formed by coating or depositing the insulating material on the top surface of the first upper insulating layer 110, injecting the upper fillers 125 into the insulating material, and hardening the insulating material. The upper fillers 125 may have a volume fraction that is 1% to 50% of a volume of the insulating material. The insulating material may include a solder resist.

The second lower insulating layer 220, in which the lower fillers 225 are distributed, may be formed below the first lower insulating layer 210. For example, the second lower insulating layer 220 may be formed by coating or depositing a precursor material, which includes the lower fillers 225 mixed with an insulating material, on the bottom surface of the first lower insulating layer 210 and hardening the insulating material. Alternatively, the second lower insulating layer 220 may be formed by coating or depositing an insulating material on the bottom surface of the first lower insulating layer 210, injecting the lower fillers 225 into the insulating material, and hardening the insulating material. The lower fillers 225 may have a volume fraction that is 1% to 50% of a volume of the insulating material. The insulating material may include a solder resist. The lower fillers 225 may be formed of or include silicon oxide (e.g., silica).

Referring to FIGS. 8 and 9, an upper protection layer 145 may be formed on the second upper insulating layer 120. For example, the upper protection layer 145 may be formed by coating or depositing an insulating material on the top surface 120a of the second upper insulating layer 120 and hardening the insulating material. The insulating material may be formed of or include the same material as the second upper insulating layer 120. For example, the insulating material may be a solder resist. A thickness T2 of the upper protection layer 145 may range from 2 µm to 5 µm. A top surface 145a of the upper protection layer 145 may be substantially flat. A degree of roughness of the top surface 145a of the upper protection layer 145 may be substantially equal or similar to a degree of roughness of the top surface 120a of the second upper insulating layer 120.

A lower protection layer 245 may be formed below the second lower insulating layer 220. For example, the lower protection layer 245 may be formed by coating or depositing an insulating material on the bottom surface of the second lower insulating layer 220 and hardening the insulating material. The insulating material may be the same material as a material of the second lower insulating layer 220. For example, the insulating material may be a solder resist. A thickness of the lower protection layer 245 may range from 2 µm to 5 µm. A bottom surface of the lower protection layer 245 may be substantially flat. A degree of roughness of the bottom surface of the lower protection layer 245 may be substantially equal or similar to a degree of roughness of the bottom surface of the second lower insulating layer 220.

In an embodiment, the second upper insulating layer 120, the upper protection layer 145, the second lower insulating layer 220, and the lower protection layer 245 may be formed by different methods.

Referring to FIG. 10, the second upper insulating layer 120, in which the upper fillers 125 are distributed, may be formed on a manufacturing substrate (not shown). For example, the second upper insulating layer 120 may be formed by coating or depositing a precursor material, which includes the upper fillers 125 mixed with an insulating material, on a top surface of a manufacturing substrate (not shown) and hardening the insulating material. Alternatively, the second upper insulating layer 120 may be formed by coating or depositing the insulating material on the top surface of the first upper insulating layer 110, injecting the upper fillers 125 into the insulating material, and hardening the insulating material.

The upper protection layer 145 may be formed on the second upper insulating layer 120. For example, the upper protection layer 145 may be formed by coating or depositing an insulating material on the top surface 120a of the second upper insulating layer 120 and by hardening the insulating material.

Thereafter, the manufacturing substrate (not shown) may be removed from the second upper insulating layer 120 to form the second upper insulating layer 120 and the upper protection layer 140 thereon. The second lower insulating layer 220 and the lower protection layer 240 may be formed by the same or similar method as the second upper insulating layer 120 and the upper protection layer 140.

Thereafter, the second upper insulating layer 120 and the upper protection layer 140 may be adhered to the resulting structure of FIG. 6. In detail, the second upper insulating layer 120 may be adhered to the first upper insulating layer 110. Here, the upper wire pattern 130 may be buried in the second upper insulating layer 120.

The second lower insulating layer 220 and the lower protection layer 240 may be adhered to the resulting structure of FIG. 6. In detail, the second lower insulating layer 220 may be adhered to the first lower insulating layer 210. Here, the lower wire pattern 230 may be buried in the second lower insulating layer 220.

The description that follows will refer to the embodiment of FIGS. 8 and 9.

Referring to FIGS. 11 and 12, during back-end processes (e.g., of fabricating a wiring board or mounting a semiconductor chip on a wiring board), the upper protection layer 140 and the lower protection layer 240 of the wiring board may be partially damaged. For example, the back-end processes may be a process of forming the openings OP1 and OP2 in the upper buildup portion UB and the lower buildup portion LB. The first openings OP1 exposing portions of the upper wire pattern 130 may be formed by patterning the upper protection layer 145 (e.g., see FIG. 8) and the second upper insulating layer 120 of the upper buildup portion UB. The second openings OP2 exposing portions of the lower wire pattern 230 may be formed by patterning the lower protection layer 245 (e.g., see FIG. 8) and the second lower insulating layer 220 of the lower buildup portion LB. In an embodiment, the back-end processes may be a process of forming under-bump pads, on which an external device will be mounted, on the wiring board or a process of forming substrate pads, to which outer terminals are attached, on the wiring board. In an embodiment, the back-end processes may be a plasma etching process which is performed during a packaging process of mounting a semiconductor chip on the wiring board. As a result of the afore-described processes, the upper protection layer 140 and the lower protection layer 240 may be partially damaged. The thickness T1 of the damaged upper protection layer 140 and a thickness of the damaged lower protection layer 240 may be smaller than the thickness T2 of the upper protection layer 145 (e.g., see FIGS. 8 and 9) before the damage-causing process and a thickness of the lower protection layer 245 (e.g., see FIGS. 8 and 9) before the damage-causing process.

Figure 13:
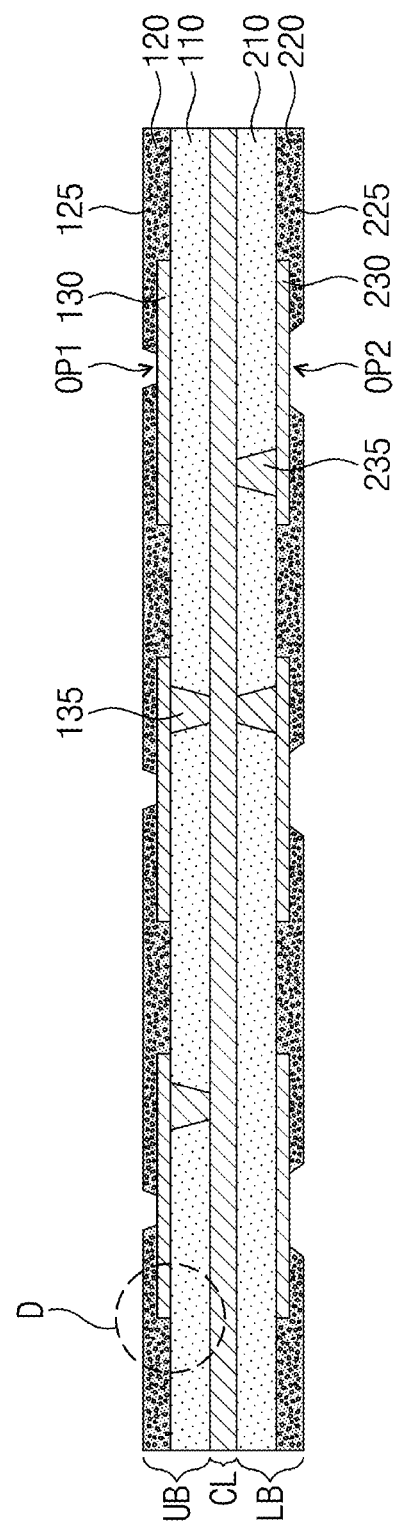
FIG. 13 is a sectional view illustrating a method of fabricating a wiring board.
Figure 14:
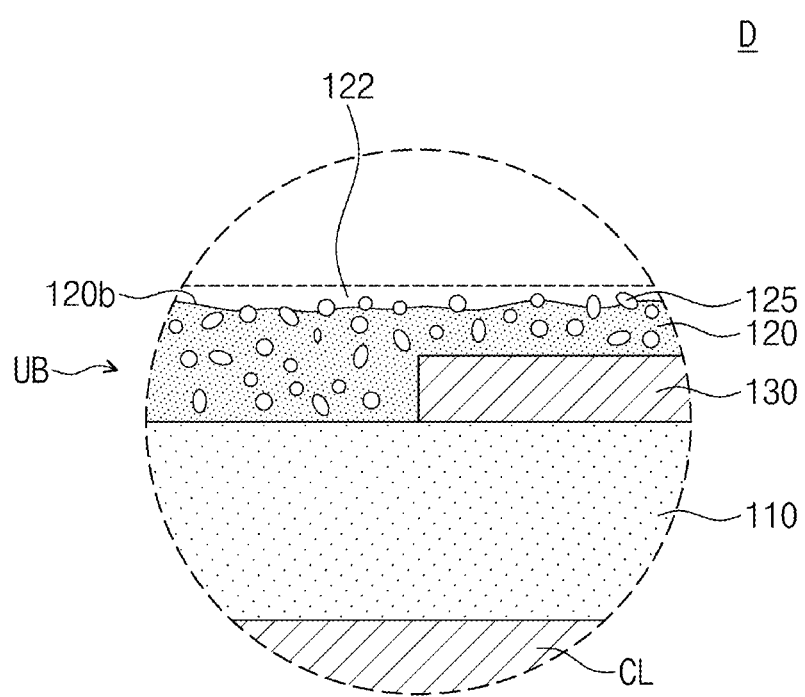
FIG. 14 is an enlarged sectional view of a portion D of FIG. 13.

Generally, in the case where the upper protection layer 140 and the lower protection layer 240 are not provided, the second upper and lower insulating layers 120 and 220 may be exposed. FIG. 13 is a sectional view illustrating a method of fabricating a wiring board. FIG. 14 is an enlarged sectional view of a portion D of FIG. 13.

As shown in FIGS. 13 and 14, as a result of the formation of the second upper and lower insulating layers 120 and 220 covering the upper and lower wire patterns 130 and 230, the formation of the wiring board may be completed. Thereafter, in the case where the afore-described back-end processes is performed, a portion 122 of the second upper insulating layer 120 and a portion of the second lower insulating layer 220 may be damaged. Accordingly, the upper fillers 125, which are distributed in the second upper insulating layer 120, may protrude above a top surface 120b of the second upper insulating layer 120 or may come out the second upper insulating layer 120 to contaminate the top surface of the wiring board. In addition, the lower fillers 225, which are distributed in the second lower insulating layer 220, may protrude above the bottom surface of the second lower insulating layer 220 or may come out the second lower insulating layer 220 to contaminate the bottom surface of the wiring board. In the case where the upper fillers 125 protrude above the top surface 120b of the second upper insulating layer 120 and the lower fillers 225 protrude above the bottom surface of the second lower insulating layer 220, the second upper and lower insulating layers 120 and 220 may have uneven surfaces, and such unevenness may be detected as a failure in an optical inspection step. The upper and lower fillers 125 and 225, which come out the second upper and lower insulating layers 120 and 220, may lead to deterioration in adhesion strength or electrical connection characteristics between the wiring board and semiconductor chips, a mold layer, or other elements.

According to an embodiment of inventive concepts, the upper protection layer 140 may be provided on the upper buildup portion UB, and the lower protection layer 240 may be provided on the lower buildup portion LB. Accordingly, it may be possible to limit and/or prevent the second upper and lower insulating layers 120 and 220 from being damaged during the back-end processes, and thereby to limit and/or prevent the upper and lower fillers 125 and 225 from being exposed or from being supplied onto the wiring board; that is, it may be possible to limit and/or prevent the wiring board from being contaminated by the upper and lower fillers 125 and 225.

FIGS. 15 and 16 are sectional views illustrating a method of fabricating a semiconductor module, according to an embodiment of inventive concepts.

Referring to FIG. 15, the under-bump pads 150 may be formed on the wiring board. For example, a conductive layer may be formed on the upper protection layer 140 of the upper buildup portion UB. Here, the conductive layer may be formed to cover the upper protection layer 140 and to fill the first openings OP1 (e.g., see FIG. 11) formed in the upper protection layer 140. The conductive layer may be coupled to the upper wire pattern 130 through the first openings. Thereafter, the conductive layer may be patterned to form the under-bump pads 150.

The under-fill member 350 may be provided on the wiring board. For example, the under-fill member 350 may be a non-conductive adhesive agent or a non-conductive film. In the case where the under-fill member 350 is a non-conductive adhesive agent, it may be formed by dispensing a liquid non-conductive adhesive agent on the upper buildup portion UB. In the case where the under-fill member 350 is a non-conductive film, it may be formed by attaching the non-conductive film to the upper buildup portion UB.

The semiconductor chip 300 may be mounted on the wiring board. For example, the semiconductor chip 300 may be coupled to the under-bump pads 150 using the chip terminals 320. A space between the semiconductor chip 300 and the upper buildup portion UB may be filled with the under-fill member 350.

Referring to FIG. 16, the mold layer 400 may be formed on the wiring board. For example, the mold layer 400 may be formed by coating an insulating material on the top surface of the upper buildup portion UB of the wiring board to enclose the semiconductor chip 300 and hardening the insulating material. The insulating member may include an insulating polymer or a thermosetting resin.

Referring back to FIG. 3, the outer terminals 250 may be provided below the wiring board 10. For example, the outer terminals 250 may be formed in the second openings OP2 (e.g., see FIG. 1), which are formed in the lower protection layer 240 of the lower buildup portion LB. The outer terminals 250 may be coupled to the lower wire patterns 230, which are exposed through the second openings.

According to an embodiment of inventive concepts, upper and lower protection layers may protect upper and lower buildup portions such that fillers in upper and lower insulating layers do not protrude above surfaces of upper and lower buildup portions. Accordingly, structural stability of a wiring board may be improved.

In addition, each of the upper and lower protection layers may be formed to an appropriate thickness, and in this case, it may be possible to limit and/or prevent a thickness of the wiring board from being excessively increased and to reduce a size of the wiring board.

According to an embodiment of inventive concepts, it may be possible to limit and/or prevent the outermost one of the insulating layers from being damaged by back-end processes, which are performed after the formation of the wiring board and thereby to limit and/or prevent the fillers from being exposed to the outside or from being supplied on the wiring board (e.g., from contaminating the wiring board).

While example embodiments of inventive concepts have been particularly shown and described, it will be understood by one of ordinary skill in the art that variations in form and detail may be made therein without departing from the spirit and scope of the attached claims.

What is claimed is:

1. A wiring board, comprising:
   a core portion having a first surface and a second surface, which are opposite to each other; and
   a first buildup portion on the first surface and a second buildup portion on the second surface, respectively,
   each of the first buildup portion and the second buildup portion including a first insulating layer on the core portion, a wire pattern on the first insulating layer,
   a second insulating layer on the first insulating layer to cover the wire pattern, and
   a protection layer covering the second insulating layer,
   the protection layer exposing a portion of the wire pattern,
   the second insulating layer including a resin layer and fillers, the fillers being distributed in the resin layer and being formed of an inorganic material,
   the fillers not being in the protection layer,
   the resin layer of the second insulating layer and the protection layer being formed of a same material
   the wire pattern of the first buildup portion being electrically connected to the wire pattern of the second buildup portion,
   a degree of roughness of a top surface of the protection layer is greater than a degree of roughness of the second insulating layer, and
   the top surface of the protection layer faces away from the core portion.

2. The wiring board of claim 1, wherein the fillers comprise silicon oxide ($SiO_2$).

3. The wiring board of claim 1, wherein
   the first insulating layer comprises a prepreg (PPG), and
   the resin layer and the protection layer comprise a solder resist.

4. The wiring board of claim 1, wherein the first buildup portion and the second buildup portion are symmetric to each other about the core portion.

5. The wiring board of claim 1, further comprising:
   an outer coupling terminal on a portion of the wire pattern of the second buildup portion that is exposed by the second insulating layer of the second buildup portion; and
   a chip coupling pad on a portion of the wire pattern of the first buildup portion that is exposed by the second insulating layer of the first buildup portion.

6. A semiconductor module, comprising:
   a package substrate including,
   a core portion,
   a first upper insulating layer embedding an upper wire pattern on a top surface of the core portion,
   upper fillers distributed in the first upper insulating layer,
   an upper protection layer covering the first upper insulating layer, a material in the upper protection layer being a same material as in the first upper insulating layer,
   a first lower insulating layer embedding a lower wire pattern on a bottom surface of the core portion, lower fillers distributed in the first lower insulating layer, and a lower protection layer covering the first lower insulating layer, a material in the lower protection layer being a same material as in the first lower insulating layer, and a thickness of the upper protection layer and a thickness of the lower protection layer ranging from 1 μm to 3 μm;

a semiconductor chip on the package substrate;

a mold layer on the package substrate, the mold layer covering the semiconductor chip, the mold layer being spaced apart from the first upper insulating layer and the upper fillers by the upper protection layer; and outer coupling terminals below the package substrate and connected to a lower surface of the package substrate, wherein a degree of roughness of a top surface of the upper protection layer is greater than a degree of roughness of a top surface of the first upper insulating layer, and a degree of roughness of a bottom surface of the lower protection layer is greater than a degree of roughness of a bottom surface of the first lower insulating layer.

7. The semiconductor module of claim 6, further comprising:

a connection terminal, wherein the semiconductor chip is on the upper protection layer, the upper protection layer exposes an exposed portion of the upper wire pattern, and the semiconductor chip is coupled to the exposed portion of the upper wire pattern using the connection terminal.

8. The semiconductor module of claim 6, wherein the outer coupling terminals are on the lower protection layer, the lower protection layer exposes an exposed portion of the lower wire pattern, and each of the outer coupling terminals is on the exposed portion of the lower wire pattern.

9. The semiconductor module of claim 6, wherein the upper fillers are not provided in the upper protection layer, and the lower fillers are not provided in the lower protection layer.

10. The semiconductor module of claim 6, wherein the upper fillers and the lower fillers comprise silicon oxide ($SiO_2$).

11. The semiconductor module of claim 6, wherein the first upper insulating layer, the first lower insulating layer, the upper protection layer, and the lower protection layer comprise a solder resist.

12. The semiconductor module of claim 6, further comprising:

a second upper insulating layer between the core portion and the first upper insulating layer; and a second lower insulating layer between the core portion and the first lower insulating layer.

13. The semiconductor module of claim 12, wherein the upper wire pattern is on a top surface of the second upper insulating layer, the first upper insulating layer covers the upper wire pattern, on the top surface of the second upper insulating layer, the lower wire pattern is on a bottom surface of the second lower insulating layer, the first lower insulating layer covers the lower wire pattern, on the bottom surface of the second lower insulating layer, and the upper wire pattern is electrically connected to the lower wire pattern.

14. The semiconductor module of claim 12, wherein the second upper insulating layer and the second lower insulating layer comprise a prepreg (PPG).

15. A wiring board, comprising:

a core portion; and buildup portions on opposite surfaces of the core portion, each of the buildup portions including a first insulating layer on the core portion, a wire pattern on the first insulating layer, a second insulating layer on the first insulating layer to cover the wire pattern, fillers distributed in the second insulating layer, and a protection layer covering the second insulating layer, the protection layer exposing a portion of the wire pattern, the second insulating layer being formed of a material different from a material of the first insulating layer, the protection layer being formed of a same material as the second insulating layer, the wire patterns of the buildup portions being electrically connected to each other, a thickness of the protection layer ranging from 1 μm to 3 μm, a degree of roughness of a surface of the protection layer being greater than a degree of roughness of the second insulating layer, and the surface of the protection layer facing the core portion.

16. The wiring board of claim 15, wherein the first insulating layer comprises a prepreg (PPG), and the second insulating layer and the protection layer comprise a solder resist.

17. The wiring board of claim 15, wherein the fillers comprise silicon oxide ($SiO_2$).

18. The wiring board of claim 1, wherein a thickness of the protection layer ranges from 1 μm to 3 μm.

* * * * *